(12) United States Patent
Trantham (10) Patent No.: US 11,105,850 B2
(45) Date of Patent: Aug. 31, 2021

(54) SECURE DEBUG SYSTEM FOR ELECTRONIC DEVICES

(71) Applicant: SEAGATE TECHNOLOGY LLC, Cupertino, CA (US)

(72) Inventor: Jon Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 321 days.

(21) Appl. No.: 15/988,137

(22) Filed: May 24, 2018

(65) Prior Publication Data

US 2019/0361073 A1 Nov. 28, 2019

(51) Int. Cl.
  *G06F 11/00* (2006.01)
  *G08B 13/00* (2006.01)
  *G01R 31/317* (2006.01)
  *G01R 31/3185* (2006.01)

(52) U.S. Cl.
  CPC . *G01R 31/31719* (2013.01); *G01R 31/31705* (2013.01); *G01R 31/318536* (2013.01)

(58) Field of Classification Search
  CPC ........ G01R 31/31719; G01R 31/31705; G01R 31/318536
  USPC .......................................................... 726/34
  See application file for complete search history.

(56) References Cited

U.S. PATENT DOCUMENTS

| | | | | |
|---|---|---|---|---|
| 5,978,937 A * | 11/1999 | Miyamori | ........... | G06F 11/3656 714/45 |
| 6,378,090 B1 * | 4/2002 | Bhattacharya | ............................... | G01R 31/318536 712/38 |
| 6,425,101 B1 * | 7/2002 | Garreau | ......... | G01R 31/318558 714/727 |
| 2002/0018380 A1 * | 2/2002 | Shinmori | ............... | G11C 29/48 365/200 |
| 2003/0046624 A1 * | 3/2003 | Muhtaroglu | ..... | G01R 31/31716 714/727 |
| 2006/0150255 A1 * | 7/2006 | Ceskutti | .................. | G06F 21/71 726/27 |
| 2006/0259828 A1 * | 11/2006 | Swoboda | ................. | G06F 21/62 714/38.1 |
| 2006/0282734 A1 * | 12/2006 | Milne | .............. | G01R 31/31719 714/742 |
| 2006/0294369 A1 * | 12/2006 | Matsushima | ........... | G06F 21/10 713/164 |
| 2007/0044158 A1 * | 2/2007 | Cruzado | ........ | G01R 31/318555 726/27 |
| 2008/0052582 A1 * | 2/2008 | Jun | ....................... | G06F 11/267 714/733 |
| 2009/0144595 A1 * | 6/2009 | Reohr, Jr. | .......... | G01R 31/3187 714/732 |

(Continued)

OTHER PUBLICATIONS

Keunyoung Park; JTAG Security System Based on Credentials; Springer—Sep. 1, 2010; p. 449-557.*

Primary Examiner — Monjur Rahim
(74) Attorney, Agent, or Firm — Hall Estill Law Firm (57) ABSTRACT

Systems and methods for secure testing and debugging of electronic devices are described. In one embodiment, the systems and methods may include an electronic device that includes a control switch placed on a device test bus of the electronic device between a debugger external to the device and a debug interface on the device. In some cases, the device may include at least one register placed on the device test bus between the debugger and authentication logic of the electronic device.

20 Claims, 7 Drawing Sheets

(56) References Cited

U.S. PATENT DOCUMENTS

| | | | |
|---|---|---|---|
| 2009/0288160 A1* | 11/2009 | Esliger | G06F 21/575 |
| | | | 726/17 |
| 2010/0199077 A1* | 8/2010 | Case | H04L 9/3271 |
| | | | 713/1 |
| 2013/0326539 A1* | 12/2013 | Otani | G06F 9/54 |
| | | | 719/313 |
| 2015/0242606 A1* | 8/2015 | Shin | G06F 21/31 |
| | | | 713/182 |
| 2015/0253993 A1* | 9/2015 | Miyoshi | G06F 11/27 |
| | | | 710/5 |
| 2016/0018464 A1* | 1/2016 | Bockelkamp | G06F 11/3656 |
| | | | 714/727 |

\* cited by examiner

SECURE DEBUG SYSTEM FOR ELECTRONIC DEVICES

SUMMARY

The present disclosure is directed to methods and systems for authenticated secure testing and debugging of electronic devices. In some embodiments, the present systems and methods may include electronic devices with secure debug interfaces, where the full interface is only accessible based on successful authentication.

An electronic device for secure debugging of protected electronics is also described. In one embodiment, the electronic device may include a control switch placed on a device test bus of the electronic device between a debugger external to the electronic device and a debug interface configured to protect electronics of the electronic device. In some embodiments, the electronic device may include authentication logic configured to determine whether the debugger is permitted to access protected electronics of the electronic device. In some cases, the electronic device may include an authentication interface including at least one register placed on the device debug bus, the at least one register being externally accessible regardless of the state of the control switch. In some cases, the at least one register may be placed on the device test bus between the debugger and the authentication logic.

In some embodiments, when the debugger is attached to the electronic device, an unbroken connection may exist to both the debugger and the authentication logic regardless of a current state of the control switch. In some cases, the authentication logic may be configured to operate autonomously and/or independently from the protected electronics of the electronic device. In some cases, the at least one register may establish a communication link between the debugger and the authentication logic.

In some embodiments, the authentication interface of at least one register may include at least one of a data in register, a data out register, a command register, or a status register, or any combination thereof. In some cases, the authentication logic may be configured to identify an authentication request based at least in part on the command register. In some embodiments, upon identifying the authentication request, the authentication logic may be configured to send a random challenge message to the debugger.

In some embodiments, the debugger may respond to the random challenge message with a signed authentication response. In some cases, upon determining the signed authentication response is valid, the authentication logic may be configured to close the control switch. In some cases, closing the control switch may allow the debugger full access to the protected electronics of the electronic device.

In some embodiments, a default state of the control switch may be the control switch in an open position. In some cases, the debug interface of protected electronics is inaccessible when the control switch is in the default state. In some cases, the device debug/test bus may include of what is commonly referred to as a Joint Testing Access Group (JTAG) parallel debug bus or a Serial Wire Debug (SWD) bus, or both.

A method for secure debugging of electronic devices is also described. In one embodiment, the method may include placing a control switch on a device test bus of a device between a debugger external to the device and a debug interface of the device, and placing at least one register on the device test bus between the debugger and an authentication logic of the debug interface on the device.

A computer-program product to improve a computer system for the secure debugging of electronic devices is also described. In one embodiment, the computer-program product may include a non-transitory computer-readable medium storing instructions thereon, the instructions being executable by one or more processors to perform the steps of authentication with authentication logic of a connected electronic device and configuring at least one register in the authentication logic of the device. In some cases, the control switch may be placed on a device debug/test bus of a device between a debugger external to the device and a debug interface on the device. In some cases, a default state of the control switch may be an open position, where protected portions of the debug interface of the device are inaccessible when the control switch is in the default state. In some cases, the at least one register may be placed on the device test bus between the debugger and an authentication logic of the debug interface on the device.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

DETAILED DESCRIPTION

Electronics test and debug interfaces allow external test equipment to access internal hardware, software, and firmware within a device, such as for product development, manufacturing test, and failure analysis. These interfaces may be referred to as JTAG (short for Joint Test Action Group) and SWD (Single-Wire-Debug) interfaces. These sorts of interfaces usefully allow for electronics to be tested and debugged during manufacture, development, testing, and for failure analysis, but if unsecured they may also leave the system open and prone to hacking. In the prior art, the debug interface are often left open (not secured) or not included in the final product. If the debug interface was included and secured, the security control/authentication was typically done using a separate communication channel path, for example, by using a separate universal asynchronous receiver-transmitter (UART) serial port as an authentication interface. Using a separate control interface often relied upon the electronics to be debugged being in an operational state, which could be problematic if the electronics were inoperable, which is the very reason why one might need to debug the electronics. Separate debug control interfaces may also require the addition of balls or pins to the electronics, adding costs.

The following relates generally to secure testing and debugging of electronic devices. It is recognized that depending upon the needs of the manufacturer, designer, or user, these interfaces may be used solely for testing of electronics, such as boundary-scan testing during device manufacture, solely for debugging of electronics and/or firmware/software, such as during product design or failure analysis, or for both testing and debugging. In this disclosure, we use the terms debugging inclusively to include debugging, testing, verification, and failure analysis. Along these same lines, the term debugger is not only meant also to include equipment for debugging software, firmware, or hardware, but also includes manufacturing testers, such as boundary scan test equipment. Regardless of whether the interface is used for testing, debugging, or both, or some related task, the systems and methods in this disclosure are applicable. It is also recognized that although the disclosure often refers to the testing and debugging of electronics, it may often be firmware, software, ROM code, etc., that operates within the electronics being debugged.

By using the same bus for authentication and debug security control as well as for debug, the embodiments described in this disclosure eliminate the need for separate debug security control interfaces and resolve other deficiencies in the prior art. Even though the authentication and security control logic is on the same bus as the debug interface, they may be physically distinct from the electronics being securely protected and debugged, so that debug test equipment may be connected in-situ (hot-plugged), authenticated, and fully connected to the electronics to be tested or debugged, even if the electronics to be debugged are in an inoperable state.

In one embodiment, the present systems and methods add secure debugging to electronic devices under test. Examples of electronic devices (e.g., devices under test (DUTs)) may include a processor, memory, microcontroller, storage device, computing device, Field Programmable Gate Arrays (FPGAs), Application-Specific Integrated Circuits (ASICs), integrated circuit, printed circuit board, any device with an integrated circuit, any device with a printed circuit board, or any combination thereof. In some cases, the protected electronics may include any circuitry and/or electronic components of the electronic device. In some cases, the present systems and methods add cryptographic logic internal to a DUT, but separate from the main hardware being controlled/debugged such as processor cores, etc.

In some embodiments, the present systems and methods include secure debugging logic circuits, authentication logic, processors, memory, registers, storage, software code, firmware, etc. In some cases, the present systems and methods may include a random number generator and/or public-key cryptography validation logic. In some cases, the present systems and methods for authentication and debug control may be referred to as a Secure Execution Environment (SEE).

In some embodiments, the present systems and methods add one or more internal switches between the debugger and the logic under protection (e.g., the debug ports of a DUT). The one or more switches may be a literal switch, such as a bus switch with logic gates for isolation, a multiplexer (MUX), etc. Additionally or alternatively, the one or more switches may include a mechanism that disables external equipment access to the protected portion of the electronics. In some cases, the one or more switches may include normally-open switches, i.e., switches that default to having the protected electronics disconnected from the debugger. In one embodiment, these switches may be under the control of the SEE. In some embodiments, the switches may be added to a Joint Test Action Group (JTAG) bus of the debugger and/or DUT.

In some embodiments, the present systems and methods may add one or more registers (e.g., public registers) that are always connected to both test equipment and SEE over JTAG, regardless of a state of the switches. The test equipment may include a computing device such as a server and/or a debugger. In one example, at least four registers may be added. In some embodiments, the four registers may include a Data In register, a Data Out register, a Command In register, and a Status Out register. In some cases, at least one of these registers may be used to establish a communication pipe between the SEE and the test equipment.

In one embodiment, the SEE may include an application specific integrated circuit (ASIC). In some cases, the ASIC may include the one or more switches and/or the one or more registers. In some cases, the ASIC may include a SEE interface that includes at least one of the one or more registers, one or more private system registers, at least one authentication logic, or any combination thereof.

In one embodiment, when a user decides to debug, e.g. via JTAG or SWD, the user may initiate an authentication request command via the command register. In one example, the command register may generate an interrupt to the SEE when written to. Alternately, the command register may be polled periodically by the SEE. In one embodiment, the SEE may respond to the authentication request command by sending back a random challenge message. In some cases, the test equipment may respond to the challenge with a cryptographically-signed authentication response (e.g., by signing the random message with a private key). If the SEE determines the response is valid, the SEE may close the debug switches, enabling the test equipment to have debug access to the chip internals of the DUT.

In one embodiment, the authentication methodology may be compliant with US National Institute of Standards and Technology (NIST) standard SP800-89

JTAG/SWD hardware may include high-level hardware, such as a so-called Debug Access Port (DAP). The DAP is essentially a router/switch that sends JTAG commands to the appropriate parts of the electronics being tested or debugged. In the current systems and methods, the always-on registers may reside on their own DAP access port. In some cases, other ports, such as those to the main logic, may be disabled, such as by the control switch. The external debugger may contain support for communicating with the DAP and its ports without involving the main logic to be debugged. For example, the debuggers may include a "System.Prepare" mode. In this mode, the debugger may allow for basic communication to DAP access ports, but does not attempt to debug or control the main logic of the device.

In one embodiment, a byte may be written to a command register via the DAP interface. The value of the byte may be pre-defined as "Authentication Request." In response, the read only memory (ROM) code in the SEE may respond with a byte on the DataOut port (e.g., DataOut register) and a byte on the SEE status register indicating more data is present. The test equipment may respond by writing a value to the command register requesting the next byte. This sequence may continue until the SEE status register indicates the last byte is sent.

In one embodiment, the script in the test equipment may collect the bytes from the DUT, form a XML message, and send the message securely using a secure protocol (e.g., transport layer security (TLS)) to a networked key server containing a private key. The key server may use a private key with the authentication request message to respond with a XML response message, containing the authentication response, which the script may be configured to unwrap. In one embodiment, the key server may request a known username and password be entered and authenticated before performing these functions.

In some embodiments, the test script may send a byte to the DataIn register of the DUT and then write the command register with "Authentication Response." The test script may write the remaining bytes, one at a time to the DUT's DataIn register immediately followed by writing the command register with a "Data Ready" command for each byte. On the last byte, the DataIn register may be written and the command register may be written with a "Data Ready, Last Byte" command.

In some cases, the DUT may use an internally-stored public key to decrypt the response data and to confirm that the random number matches the number originally sent. If correct (e.g., the numbers match), the DUT DAP may be configured to close debug protection switches, thereby fully enabling the device's debug ports.

Figure 1:
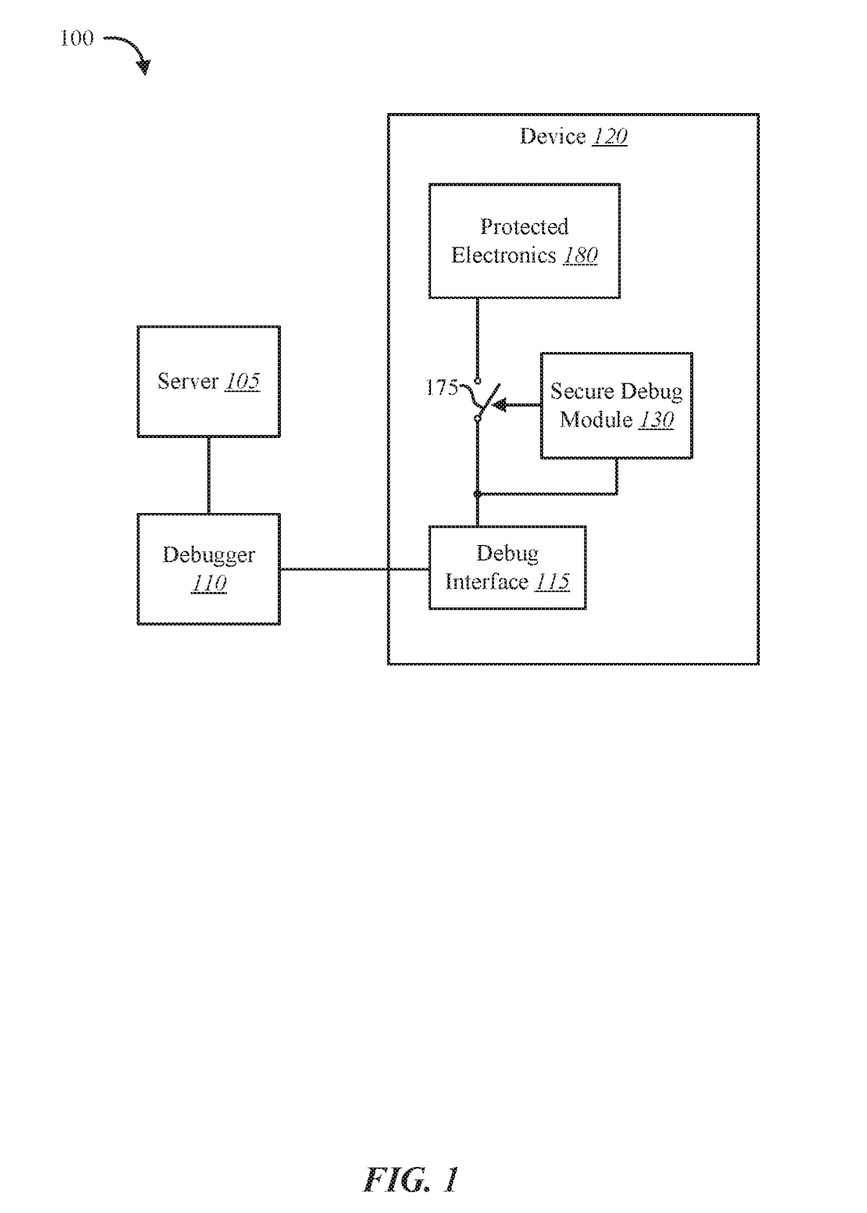
FIG. 1 is a block diagram of an example of a system in accordance with various embodiments.

FIG. 1 is a block diagram illustrating one embodiment of an environment 100 in which the present systems and methods may be implemented. The environment 100 may include server 105, debugger 110, and device 120. As shown, device 120 may include debug interface 115, secure debug module 130, and protected electronics 180. Protected electronics 180 may include any combination of circuitry, circuit boards, and/or electronics (e.g., electronic components, etc.).

In some embodiments, the systems and methods described herein may be performed on a single device such as device 120. In some cases, the methods described herein may be performed on multiple devices or a network of devices such as the electronics of an automobile, for example. Further examples of device 120 may include at least one of an ASIC, a FPGA, a microprocessor, a microcontroller, an embedded system, a hard disk drive, a computing device, a mobile computing device, a storage server, a storage enclosure, a storage controller, storage drives in a distributed storage system, storage drives on a cloud storage system, storage devices on personal computing devices, storage devices on a server, or any combination thereof. In some configurations, device 120 may include secure debug module 130.

In one embodiment, device 120 may be an electronic device with one or more processors, memory, and/or one or more storage devices. In some cases, device 120 may include a wireless storage device. In some embodiments, device 120 may include a cloud drive for a home or office setting. In one embodiment, device 120 may include a network device such as a switch, router, access point, or any combination thereof. In one example, device 120 may be operable to receive data streams, store and/or process data, and/or transmit data from, to, or in conjunction with one or more local and/or remote computing devices.

The device 120 may include a database. In some cases, the database may be internal to device 120. In some embodiments, protected electronics 180 may include a database. Additionally, or alternatively, device 120 may include a wired and/or a wireless connection to an external database. Additionally, as described in further detail herein, software and/or firmware (for example, stored in memory) may be executed on a processor of device 120. Such software and/or firmware executed on the processor may be operable to cause the device 120 to monitor, process, summarize, present, and/or send a signal associated with the operations described herein.

In some embodiments, secure debug module 130 and/or protected electronics 180 may connect to device 120 via one or more networks. Examples of networks include cloud networks, local area networks (LAN), wide area networks (WAN), virtual private networks (VPN), a personal area network, near-field communication (NFC), a telecommunications network, wireless networks (using 802.11, for example), and cellular networks (using 3G and/or LTE, for example), or any combination thereof. In some configurations, the network may include the Internet and/or an intranet. The device 120 may receive and/or send signals over a network via a wireless communication link. In some embodiments, a user may access the functions of device 120 via a local computing device, remote computing device, and/or network device. For example, in some embodiments, device 120 may include an application that interfaces with a user. In some cases, device 120 may include an application that interfaces with one or more functions of a network device, remote computing device, and/or local computing device.

In one embodiment, device 120 may include a debug interface 115. In one embodiment, the debug interface 115 may include a parallel bus, such as, for example, a JTAG Institute of Electrical and Electronics Engineers (IEEE) 1149.1 parallel bus. Additionally or alternatively, the debug interface 115 may include a serial bus, such as, for example, a SWD IEEE 1149.7 serial bus.

In one embodiment, device 120 may include a secure debug module 130 which may control access to protected electronics 180 through debug interface 115 by switch 175. In some cases, server 105 may control one or more operations of debugger 110. Additionally or alternatively, server 105 may include a key server. In some cases, debugger 110 may initiate a request to access protected electronics 180. In some cases, the request may be sent by debugger 110 to debug interface 115. In some cases, debug interface 115 may communicate the request to secure debug module 130. In some embodiments, secure debug module 130 may implement one or more authentication protocols to control access to protected electronics 180. In some cases, secure debug module 130 may validate a request based at least in part on a private key stored in server 105 and/or a public key stored in device 120. Upon successful validation of a request to access protected electronics 180, the secure debug module 130 may enable temporary access to protected electronics 180 by closing switch 175. For example, secure debug module 130 may give debugger 110 temporary access to protected electronics 180.

Figure 2:
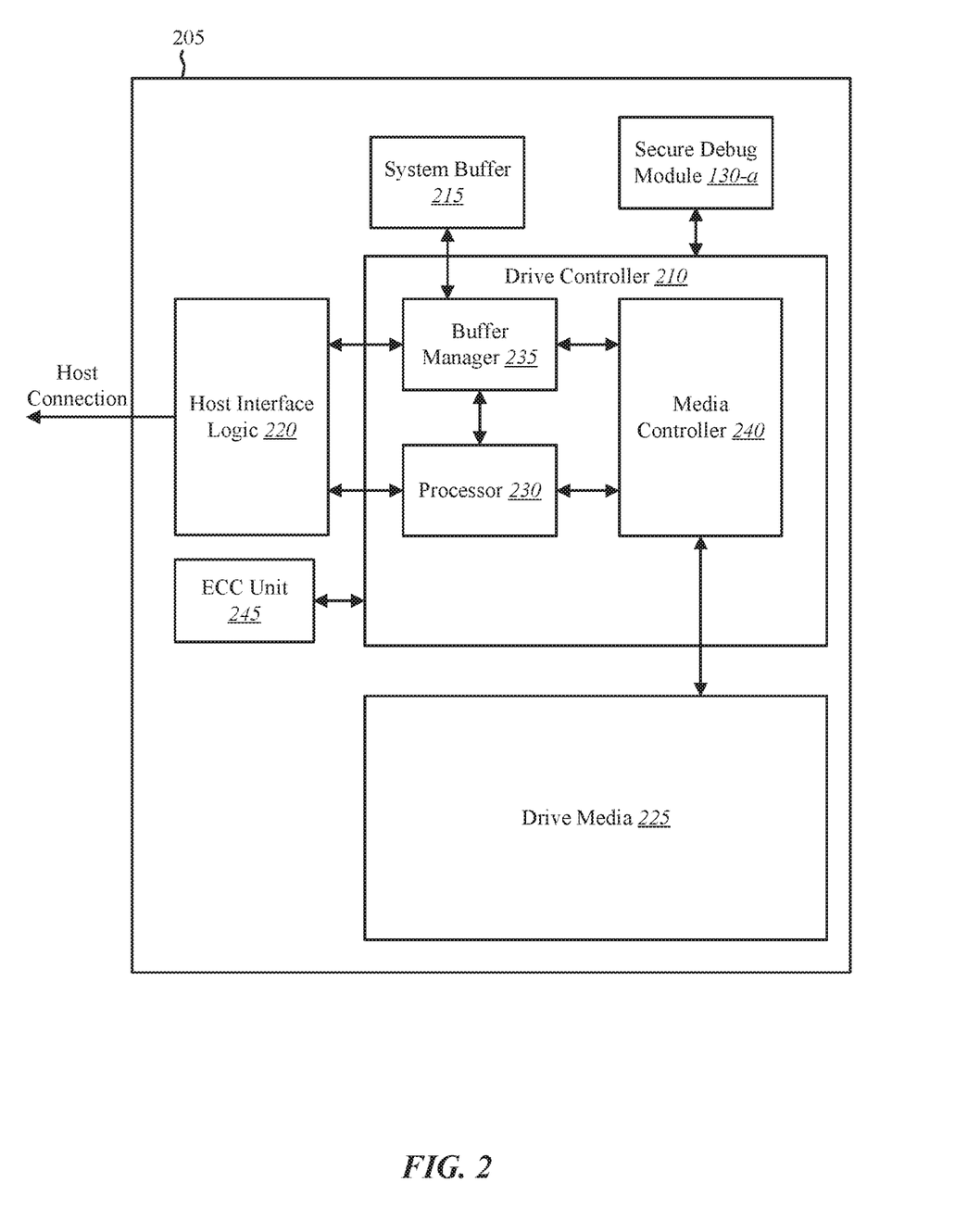
FIG. 2 shows a block diagram of a device in accordance with various aspects of this disclosure.

FIG. 2 shows a block diagram 200 of an apparatus 205 for use in electronic communication, in accordance with various aspects of this disclosure. The apparatus 205 may be an example of one or more aspects of device 120 described with reference to FIG. 1. The apparatus 205 may include a drive controller 210, system buffer 215, host interface logic 220, drive media 225, and secure debug module 130-a. Each of these components may be in communication with each other and/or other components directly and/or indirectly.

One or more of the components of the apparatus 205, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used such as Structured/Platform ASICs, Field Programmable Gate Arrays (FPGAs), and other custom ICs, which may be programmed in any manner known in the art. The functions of each module may also be implemented, in whole or in part, with instructions embodied in memory formatted to be executed by one or more general and/or application-specific processors.

In one embodiment, the drive controller 210 may include a processor 230, a buffer manager 235, and a media controller 240. The drive controller 210 may process, via processor 230, read and write requests in conjunction with the host interface logic 220, the interface between the apparatus 205 and the host of apparatus 205. The system buffer 215 may hold data temporarily for internal operations of apparatus 205. For example, a host may send data to apparatus 205 with a request to store the data on the drive media 225. Drive media 225 may include one or more disk platters, flash memory, any other form of non-volatile memory, or any combination thereof. The drive controller 210 may process the request and store the received data in the drive media 225. In some cases, a portion of data stored in the drive media 225 may be copied to the system buffer 215 and the processor 230 may process or modify this copy of data and/or perform an operation in relation to this copy of data held temporarily in the system buffer 215. In some cases, error correction control (ECC) unit 245 may perform error correction on data stored in drive media 225.

In some embodiments, secure debug module 130-a may include at least one of one or more processors, one or more memory devices, one or more storage devices, instructions executable by one or more processors stored in one or more memory devices and/or storage devices, or any combination thereof. Although depicted outside of drive controller 210, in some embodiments, secure debug module 130-a may include software, firmware, and/or hardware located within drive controller 210 and/or operated in conjunction with drive controller 210. For example, secure debug module 130-a may include at least a portion of processor 230, buffer manager 235, and/or media controller 240. In one example, secure debug module 130-a may include one or more instructions executed by processor 230, buffer manager 235, and/or media controller 240.

Figure 3:
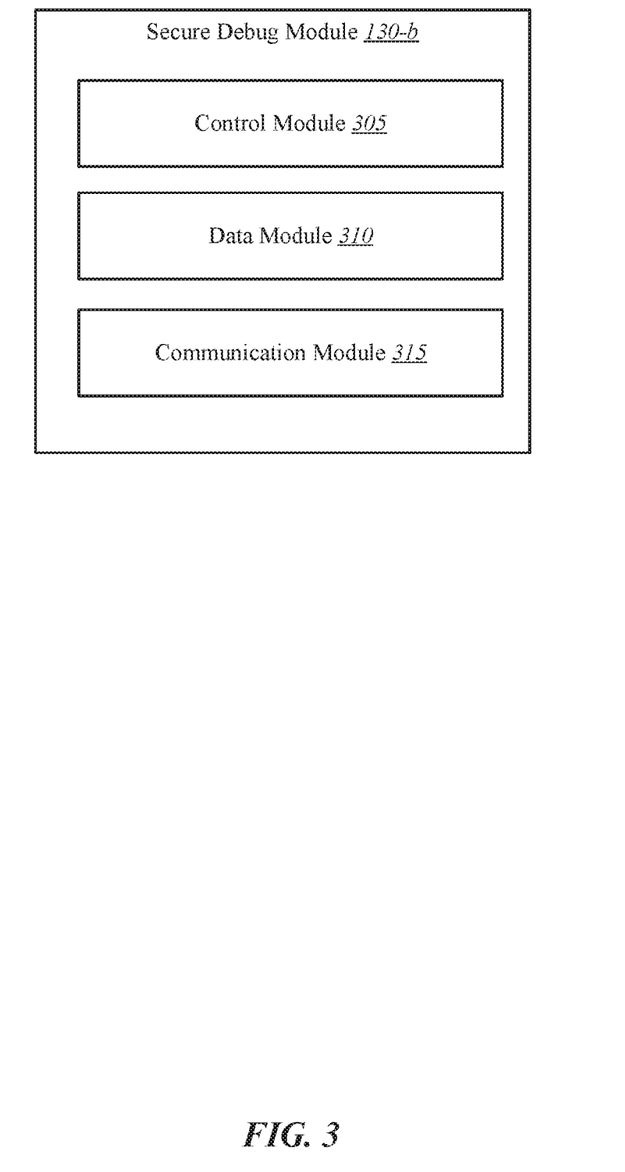
FIG. 3 shows a block diagram of one or more modules in accordance with various aspects of this disclosure.

FIG. 3 shows a block diagram of secure debug module 130-b. The secure debug module 130-b may include one or more processors, memory, and/or one or more storage devices. The secure debug module 130-b may include control module 305, data module 310, and communication module 315. The secure debug module 130-b may be one example of secure debug module 130 of FIGS. 1 and/or 2. Each of these components may be in communication with each other.

In one embodiment, secure debug module 130-b may perform one or more operations described herein to create a secure debug control system. In one embodiment, control module 305 may perform one or more operations described herein in conjunction with a control switch placed on a device test bus of the electronic device. In some cases, the device test bus may include a parallel or serial debug bus as described above, or both. In some examples, the control switch may be placed between a debugger external to the electronic device and a debug interface on the electronic device. In some embodiments, secure debug module 130-b may include the debug interface and/or the debugger.

In some embodiments, the debug interface may include one or more debug ports (e.g., test access port, JTAG port, processor debug port, etc.). In some embodiments, the electronic device may include a computing device, a component of a computing device, a storage drive (e.g., disk drive, solid state drive, etc.), a component of a storage drive, or any combination thereof. In some cases, the electronic device may include any device that includes at least one integrated circuit. Additionally or alternatively, the electronic device may include a printed circuit board.

In some embodiments, data module 310 may perform one or more operations described herein in conjunction with at least one register placed on the device test bus. In some cases, control module 305 may include the at least one register. In some cases, the at least one register may include at least one of a data in register, a data out register, a command register, or a status register, or any combination thereof. In some cases, at least one of the one or more registers may be placed between the debugger and a authentication logic of the debug interface on the electronic device. In some cases, control module 305 may perform one or more operations described herein in conjunction with the authentication logic. In some cases, control module 305 may include the authentication logic. In some embodiments, the authentication logic may include a random number generator or public-key cryptography validation logic, or both.

In some embodiments, when the debugger is attached to the electronic device, an unbroken connection may exist between the debugger and the authentication logic regardless of a current state of the control switch. In some cases, the authentication logic may include at least one of one or more microcontrollers, one or more application specific integrated circuits (ASICs), one or more field programmable gate arrays (FPGAs), one or more processors, or any combination thereof. In some cases, the authentication logic may include a microcontroller embedded within an ASIC.

In one embodiment, communication module 315 may be configured to establish a communication link between the authentication logic and the debugger. In some cases, data module 310 may be configured to identify an authentication request based at least in part on the command register. In some cases, the data module 310 may generate an interrupt to the authentication logic when the command register is written to. In one example, the command register may be written to in conjunction with the generation of an authentication request. The data module 310, in conjunction with the command register, may generate an interrupt and send the interrupt to the authentication logic. Upon receiving the interrupt, the control module 305, in conjunction with the authentication logic, may identify the authentication request. Additionally or alternatively, the control module 305, in conjunction with the authentication logic, may identify an authentication request based at least in part on the control module 305 polling, in conjunction with the authentication logic, the command register on a periodic basis.

In some embodiment, upon identifying the authentication request, the control module 305, in conjunction with the authentication logic, may be configured to send a random challenge message to the debugger. In some cases, the control module 305, in conjunction with the debugger, may be configured to sign an authentication response. In some embodiments, communication module 315 may respond to the random challenge message with the signed authentication response. In one example, the control module 305, in conjunction with the debugger, may use a private key to cryptographically sign the random challenge message and the communication module 315 may then send the signed random challenge message to the authentication logic.

In some embodiments, upon determining the signed authentication response is valid, the control module 305, in conjunction with the authentication logic, may be configured to close the control switch. In some cases, closing the control switch may enable the debugger access to the full debug interface of the electronic device. In some cases, the control module 305, in conjunction with the authentication logic, may use a public key to validate that signed authentication response.

In some cases, a default state of the control switch may be open. In some embodiments, the debug interface of the electronic device may be inaccessible when the control switch is in the default state. Thus, in some embodiments, the debugger may be blocked from accessing the debug interface while the control switch is open.

Figure 4:
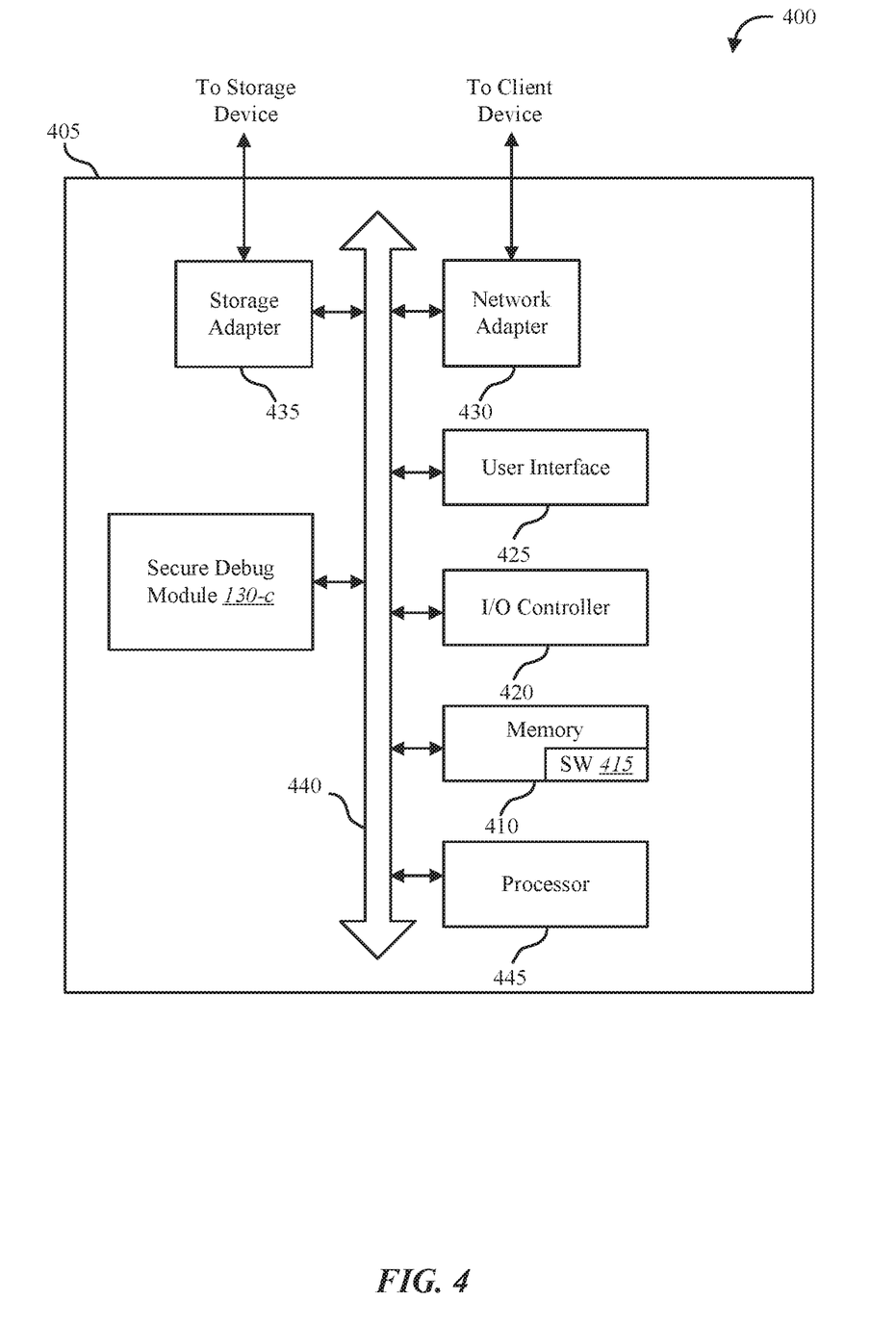
FIG. 4 shows a diagram of a system in accordance with various aspects of this disclosure.

FIG. 4 shows a system 400 for secure debugging of electronic devices, in accordance with various examples. System 400 may include an apparatus 405, which may be an example of any one of device 120 of FIG. 1 and/or apparatus 205 of FIG. 2.

Apparatus 405 may include components for bi-directional voice and data communications including components for transmitting communications and components for receiving communications. For example, apparatus 405 may communicate bi-directionally with one or more storage devices and/or client systems. This bi-directional communication may be direct (apparatus 405 communicating directly with a storage system, for example) and/or indirect (apparatus 405 communicating indirectly with a client device through a server, for example).

Apparatus 405 may also include a processor module 445, and memory 410 (including software/firmware code (SW) 415), an input/output controller module 420, a user interface module 425, a network adapter 430, and a storage adapter 435. The software/firmware code 415 may be one example of a software application executing on apparatus 405. The network adapter 430 may communicate bi-directionally, via one or more wired links and/or wireless links, with one or more networks and/or client devices. In some embodiments, network adapter 430 may provide a direct connection to a client device via a direct network link to the Internet via a POP (point of presence). In some embodiments, network adapter 430 of apparatus 405 may provide a connection using wireless techniques, including digital cellular telephone connection, Cellular Digital Packet Data (CDPD) connection, digital satellite data connection, and/or another connection. The apparatus 405 may include secure debug module 130-c, which may perform the functions described above for the secure debug module 130 of FIGS. 1, 2, and/or 3.

The signals associated with system 400 may include wireless communication signals such as radio frequency, electromagnetics, local area network (LAN), wide area network (WAN), virtual private network (VPN), wireless network (using 802.11, for example), cellular network (using 3G and/or LTE, for example), and/or other signals. The network adapter 430 may enable one or more of WWAN (GSM, CDMA, and WCDMA), WLAN (including BLUETOOTH® and Wi-Fi), WMAN (WiMAX) for mobile communications, antennas for Wireless Personal Area Network (WPAN) applications (including RFID and UWB), or any combination thereof.

One or more buses 440 may allow data communication between one or more elements of apparatus 405 such as processor module 445, memory 410, I/O controller module 420, user interface module 425, network adapter 430, and storage adapter 435, or any combination thereof.

The memory 410 may include random access memory (RAM), read only memory (ROM), flash memory, and/or other types. The memory 410 may store computer-readable, computer-executable software/firmware code 415 including instructions that, when executed, cause the processor module 445 to perform various functions described in this disclosure. Alternatively, the software/firmware code 415 may not be directly executable by the processor module 445 but may cause a computer (when compiled and executed, for example) to perform functions described herein. Alternatively, the computer-readable, computer-executable software/firmware code 415 may not be directly executable by the processor module 445, but may be configured to cause a computer, when compiled and executed, to perform functions described herein. The processor module 445 may include an intelligent hardware device, for example, a central processing unit (CPU), a microcontroller, an application-specific integrated circuit (ASIC), field programmable gate array (FPGA), or any combination thereof.

In some embodiments, the memory 410 may contain, among other things, the Basic Input-Output system (BIOS) which may control basic hardware and/or software operation such as the interaction with peripheral components or devices. For example, at least a portion of the secure debug module 130-c to implement the present systems and methods may be stored within the system memory 410. Applications resident with system 400 are generally stored on and accessed via a non-transitory computer readable medium, such as a hard disk drive or other storage medium. Additionally, applications can be in the form of electronic signals modulated in accordance with the application and data communication technology when accessed via a network interface such as network adapter 430.

Many other devices and/or subsystems may be connected to and/or included as one or more elements of system 400 (for example, a personal computing device, mobile computing device, smart phone, server, internet-connected device, cell radio module, or any combination thereof). In some embodiments, all of the elements shown in FIG. 4 need not be present to practice the present systems and methods. The devices and subsystems can be interconnected in different ways from that shown in FIG. 4. In some embodiments, an aspect of some operation of a system, such as that shown in FIG. 4, may be readily known in the art and are not discussed in detail in this application. Code to implement the present disclosure can be stored in a non-transitory computer-readable medium such as one or more of system memory 410 or other memory. The operating system provided on I/O controller module 420 may be a mobile device operation system, a desktop/laptop operating system, or another known operating system.

The I/O controller module 420 may operate in conjunction with network adapter 430 and/or storage adapter 435. The network adapter 430 may enable apparatus 405 with the ability to communicate with client devices such as device 120 of FIG. 1, and/or other devices over a communication network. Network adapter 430 may provide wired and/or wireless network connections. In some cases, network adapter 430 may include an Ethernet adapter or Fibre Channel adapter. Storage adapter 435 may enable apparatus 405 to access one or more data storage devices. The one or more data storage devices may include two or more data tiers each. The storage adapter 435 may include one or more of an Ethernet adapter, a Fibre Channel adapter, Fibre Channel Protocol (FCP) adapter, a SCSI adapter, and iSCSI protocol adapter.

Figure 5:
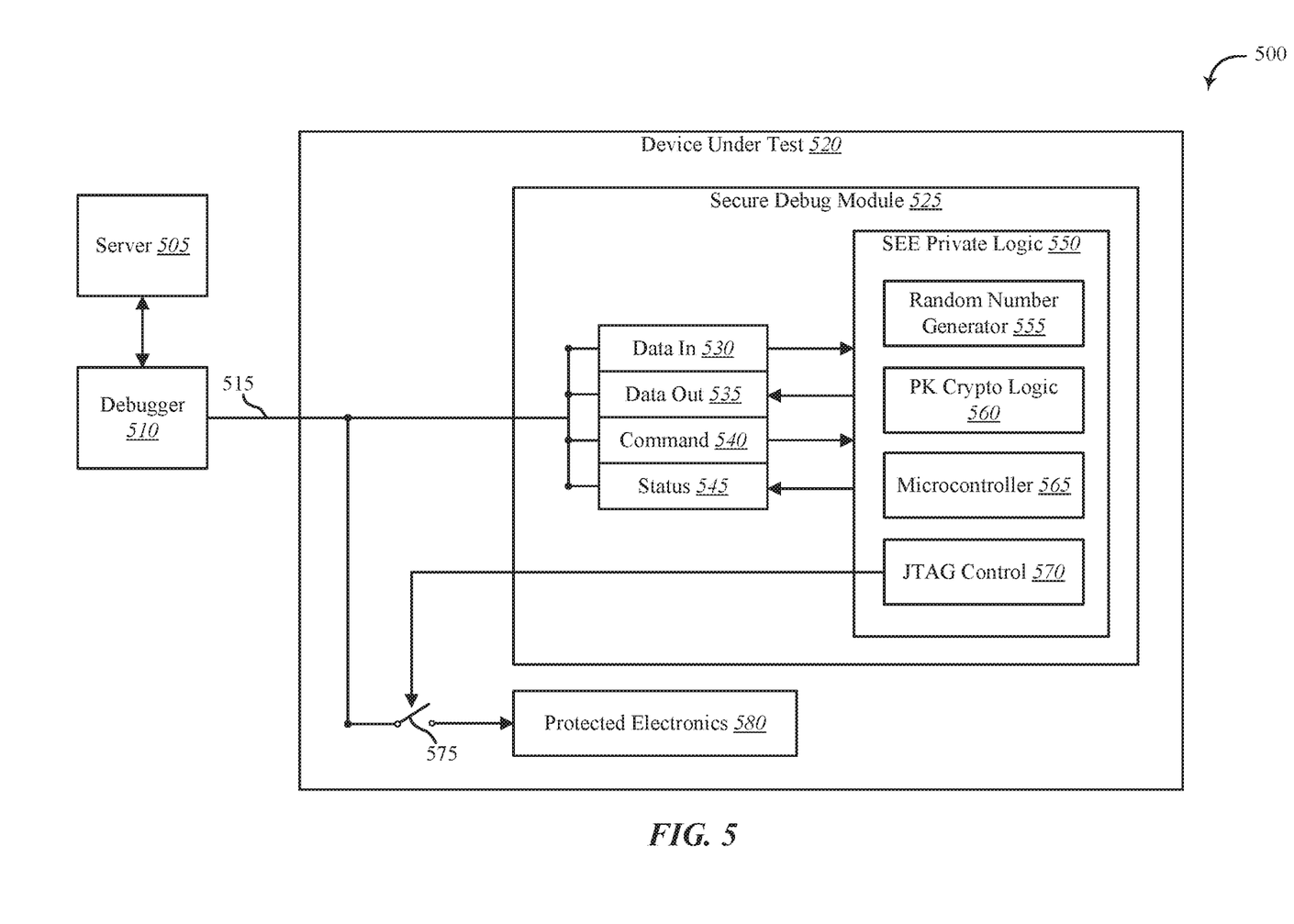
FIG. 5 shows one embodiment of an environment in accordance with various aspects of this disclosure.

FIG. 5 shows an environment 500 for secure debugging of electronic devices, in accordance with various examples. At least one aspect of environment 500 may be implemented in conjunction with device 120 of FIG. 1, apparatus 205 of FIG. 2, and/or secure debug module 130 depicted in FIGS. 1, 2, 3, and/or 4.

As depicted, environment 500 may include server 505, debugger 510, debug interface 515, and device under test (DUT) 520. In some cases, server 505 may include a key server. In some embodiments, DUT 520 may include customized circuitry (e.g., ASIC, FPGA, microcontroller, etc.). In one example, at least a portion of DUT 520 may be implemented in an ASIC.

As shown, DUT 520 may include authentication logic such as secure debug module 525 and control switch 575. In one embodiment, secure debug module 525 may be an example of any combination of secure debug modules 130 of FIGS. 1-4. As shown, the protected debug port of protected electronics 580 may be connected to control switch 575 as shown. As depicted, secure debug module 525 may include data in register 530, data out register 535, command register 540, status register 545, and SEE private logic 550. In some embodiments, registers 530, 535, 540, 545 may be logically located within a DAP (a Debug Access Port). As illustrated, SEE private logic 550 may include random number generator 555, public key cryptographic (PK crypto) logic 560, microcontroller 565, and JTAG control 570. In one embodiment, the electronics of Secure Debug Module 525 may be independent of protected electronics 580, such that Secure Debug Module 525 is responsive even if protected electronics 580 has malfunctioned.

In one embodiment, a user may use debugger 510 to initiate a request to enable access to the protected debug port of protected electronics 580. In some cases, initiating the request may invoke authentication of the request. In one example, a user may provide his/her username and password to debugger 510 (e.g., entering the username and password at server 505 or another computing device for example). In some cases, providing the username and password may invoke an authentication script of debugger 510. In one embodiment, invoking the authentication script may include debugger 510 writing an authentication request byte to command register 540.

In some embodiments, microcontroller 565 may identify the authentication request byte written to command register 540. Upon identifying the authentication request byte written to command register 540, microcontroller 565 may instruct random number generator 555 to generate a random number. Microcontroller 565 may use the generated random number to generate a random number based challenge.

In some embodiments, microcontroller 565 may send the random number based challenge to debugger 510. In response, debugger 510 may send the random number based challenge as well as the username and password to server 505. In one embodiment, server 505 may validate the random number based challenge as well as the username and password. Upon validating username and password and/or the random number based challenge, server 505 may generate an authentication response. In some cases, the authentication response may include server 505 using a private key to cryptographically sign the random number based challenge. In some embodiments, server 505 may send the authentication response to debugger 510. In some embodiments, debugger 510 may send the authentication response to command register 540.

In one embodiment, PK crypto logic 560 may decrypt the signed random number based challenge in the authentication response. In some cases, PK crypto logic 560 may use an internally-stored public key to decrypt the signed random number based challenge. Upon determining the authentication response is valid, JTAG control 570 may close control switch 575. Upon closing control switch 575, debugger 510 may be granted temporary access to protected electronics 580. In some cases, the temporary access may expire after a predetermined time of inactivity, upon which JTAG control 570 may open control switch 575 to block further access. In some cases, debugger 510 may indicate termination of a debugging process. Upon identifying an indication of the termination of the debugging process, JTAG control 570 may open control switch 575 to block further access to protected electronics 580.

Figure 6:
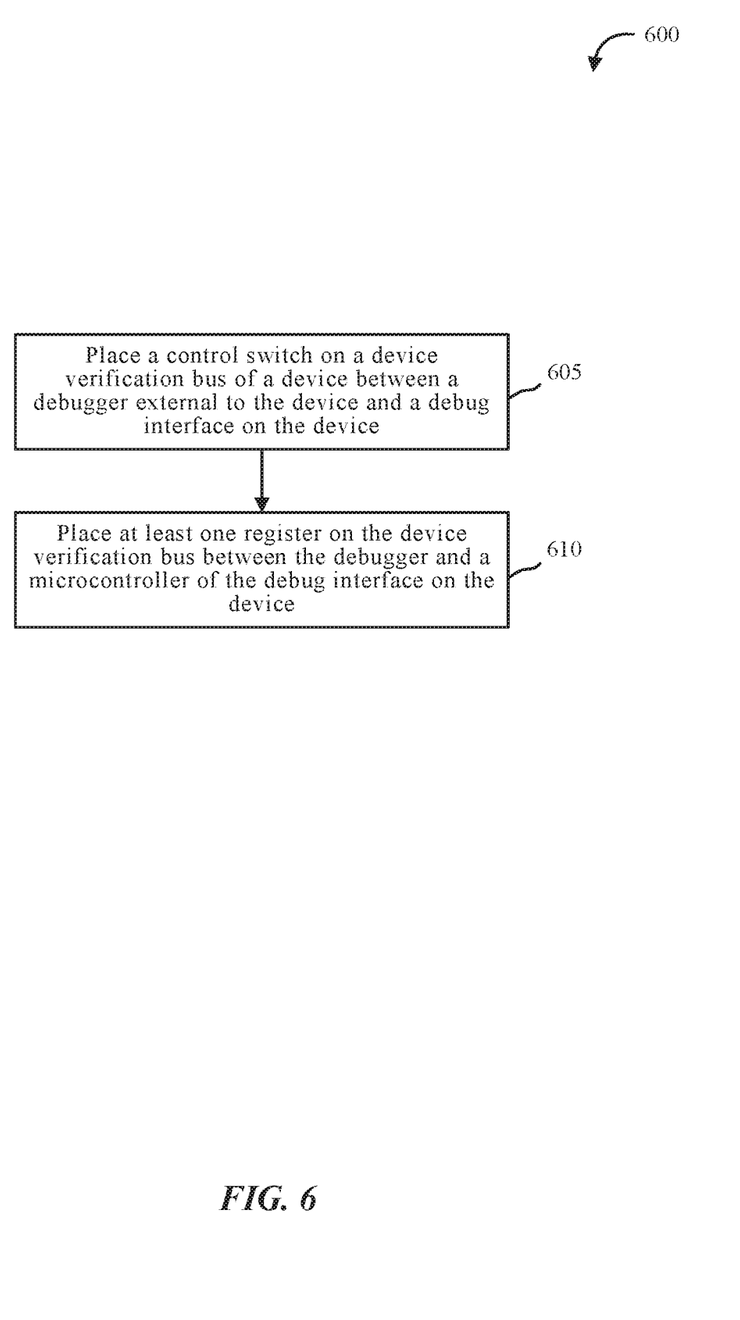
FIG. 6 is a flow chart illustrating an example of a method in accordance with various aspects of this disclosure.

FIG. 6 is a flow chart illustrating an example of a method 600 for secure debugging of electronic devices, in accordance with various aspects of the present disclosure. One or more aspects of the method 600 may be implemented in conjunction with device 120 of FIG. 1, apparatus 205 of FIG. 2, and/or secure debug module 130 depicted in FIGS. 1, 2, 3, and/or 4. In some examples, a backend server, computing device, and/or storage device may execute one or more sets of code to control the functional elements of the backend server, computing device, and/or storage device to perform one or more of the functions described below. Additionally or alternatively, the backend server, computing device, and/or storage device may perform one or more of the functions described below using special-purpose hardware.

At block 605, method 600 may include placing a control switch on a device test bus of a device between a debugger external to the device and a debug interface on the device. Examples of the device may include at least one of an integrated circuit, a printed circuit board, a processor, memory, a computing device, a storage device, or any combination thereof. At block 610, method 600 may include placing at least one register on the device test bus between the debugger and authentication logic of the debug interface on the device.

The operation(s) at block 605-610 may be performed using the secure debug module 130 described with reference to FIGS. 1-4 and/or another module. Thus, the method 600 may provide for secure debugging of electronic devices. It should be noted that the method 600 is just one implementation and that the operations of the method 600 may be rearranged, omitted, and/or otherwise modified such that other implementations are possible and contemplated.

Figure 7:
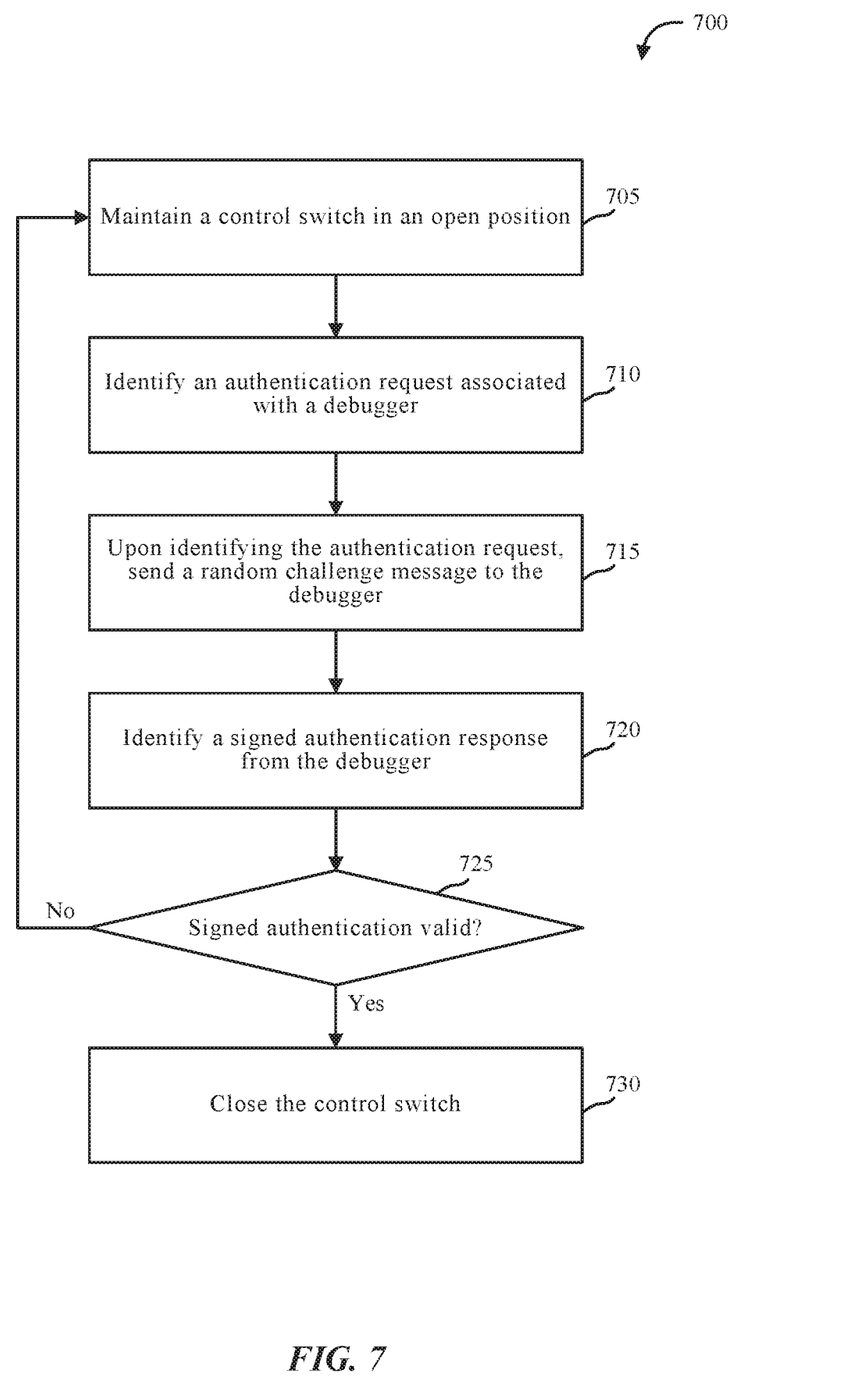
FIG. 7 is a flow chart illustrating an example of a method in accordance with various aspects of this disclosure.

FIG. 7 is a flow chart illustrating an example of a method 700 for secure debugging of electronic devices, in accordance with various aspects of the present disclosure. One or more aspects of the method 700 may be implemented in conjunction with device 120 of FIG. 1, apparatus 205 of FIG. 2, and/or secure debug module 130 depicted in FIGS. 1, 2, 3, and/or 4. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 705, method 700 may include maintaining a control switch in an open position. In one example, the control switch may be part of a device (e.g., a device under test). In one embodiment, the control switch in the open position may block a debugger from accessing a debug interface of the device.

At block 710, method 700 may include identifying an authentication request associated with a debugger attached to the device. In some cases, the authentication request may be identified based at least in part on a state of a command register of the debugging interface. At block 715, upon identifying the authentication request, method 700 may include sending a random challenge message to the debugger.

At block 720, method 700 may include identifying a signed authentication response from the debugger. The debugger may send signed authentication in response to the random challenge message sent to the debugger.

At block 725, method 700 may include determining whether the signed authentication is valid. At block 730, upon determining the signed authentication response is valid, method 700 may include closing the control switch. Closing the control switch may enable the debugger to access a debug interface of the device. Conversely, upon determining the signed authentication response is invalid, method 700 may include returning to block 705 to maintain the control switch in an open position, resulting in the debugger being block from accessing the debug interface of the device. In one embodiment, once the method indicates that debugging is completed, the method may return the switch to the open position, resulting in the debugger being block from accessing the debug interface of the device.

The operations at blocks 705-730 may be performed using the secure debug module 130 described with reference to FIGS. 1-4 and/or another module. Thus, the method 700 may provide for secure debugging of electronic devices. It should be noted that the method 700 is just one implementation and that the operations of the method 700 may be rearranged, omitted, and/or otherwise modified such that other implementations are possible and contemplated.

In some examples, aspects from two or more of the methods 600 and 700 may be combined and/or separated. It should be noted that the methods 600 and 700 are just example implementations, and that the operations of the methods 600 and 700 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and/or microwave are included in the definition of medium. Disk and disc, as used herein, include any combination of compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct an electronic system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. An electronic device configured to create a secure debug control system, comprising:
   a control switch coupled to a device test bus of the electronic device, the device test bus configured to connect a debugger external to the electronic device to a debug interface configured to protect electronics of the electronic device, the control switch in a normally open position to decouple the debugger from the electronics;
   authentication logic having a programmable processor configured to determine whether the debugger is permitted to access the electronics of the electronic device through the control switch; and
   an authentication interface, comprising at least one register coupled to the device test bus in series between the debugger and the debug interface of the electronic device and in parallel with the control switch, the authentication logic closing the control switch responsive to an authentication request placed in the at least one register by the debugger via the device test bus and responsive to an authentication sequence carried out between the debugger and the authentication logic in response to the authentication request, the at least one register upstream of the processor of the authentication logic along the device test bus.

2. The electronic device of claim 1, the authentication interface being communicable with the debugger prior to successful authentication, wherein the authentication logic is configured to operate autonomously from the protected electronics of the electronic device.

3. The electronic device of claim 1, wherein the at least one register further stores an authentication value that is transferred across the device test bus to the debugger during the authentication sequence.

4. The electronic device of claim 1, wherein the at least one register includes a data in register, a data out register, a command register, and a status register.

5. The electronic device of claim 4, wherein the authentication logic identifies the value placed in the at least one register by the debugger as an authentication request based at least in part on the command register.

6. The electronic device of claim 1, further comprising, upon identifying the value placed in the at least one register by the debugger as an authentication request, the authentication logic is further configured to send a random challenge message to the debugger via the at least one register.

7. The electronic device of claim 6, wherein the debugger is further configured to respond to the random challenge message with a signed authentication response which is loaded to the at least one register by the debugger.

8. The electronic device of claim 7, wherein upon determining the signed authentication response is valid, the authentication logic is further configured to close the control switch, allowing the debugger full access to the debug interface of the electronics of the electronic device.

9. The electronic device of claim 1, wherein a default state of the control switch is open, wherein the debug interface of the electronic device is inaccessible when the control switch is in the default state.

10. The electronic device of claim 1, wherein the device test bus includes a Joint Testing Access Group (JTAG) bus or a Serial Wire Debug (SWD) bus, or both, and no other interfaces of the device are utilized during authentication of the debugger to the device.

11. A method to create a secure debug control system comprising:
coupling a debugger to a device under test (DUT) via a device test bus, the DUT having a debug interface and a normally open control switch coupled to the device test bus in series between the debugger and electronics of the DUT;
using the debugger to transfer, via the device test bus, an authentication request to a register coupled to the device test bus upstream of a processor of the debug interface along the device test bus, the register arranged in parallel with the normally open control switch along the device test bus, the authentication request configured to facilitate authentication of the debugger to the DUT; and
closing the normally open control switch responsive to an authentication sequence carried out between the processor of the debug interface and the debugger responsive to placement of the authentication request in the register.

12. The method of claim 11, further comprising:
forwarding, from the register, an authentication value to the debugger via the device test bus responsive to the authentication request;
receiving, from the debugger, a follow up confirmation value responsive to the authentication value, the follow up confirmation value transmitted by the debugger over the device test bus and placed in the register; and
closing the normally open control switch responsive to the follow up confirmation value in the register.

13. The method of claim 11, wherein the register establishes a communication link between authentication logic of the DUT and the debugger.

14. The method of claim 11, wherein the register includes at least one of a data in register, a data out register, a command register, or a status register, or any combination thereof.

15. The method of claim 11, further comprising performing an authentication sequence via the device test bus using values placed in the register by the respective debugger and authentication logic of the DUT, the authentication sequence resulting in authentication of the debugger to the DUT without utilization of any additional interfaces of the DUT.

16. The method of claim 11, further comprising sending a random challenge message to the debugger via the register and the device test bus in response to the authentication request from the debugger.

17. The method of claim 16, further comprising using a random number generator of the DUT to generate the random challenge message.

18. A computer-program product to create a secure debug control system, the computer-program product comprising a non-transitory computer-readable medium storing instructions thereon, the instructions being executable by one or more processors to perform steps of:
reading an authentication request in a register coupled to a device test bus of a device under test (DUT), the authentication supplied to the register via the device test bus from a debugger to request access, by the debugger, to electronics of the DUT, the register connected upstream of a processor of a secure debug module of the DUT and connected in parallel with a normally open switch connected to the electronics of the DUT;
generating an authentication value, by the processor of the secure debug module of the DUT, responsive to the authentication request and placing the authentication value in the register for forwarding to the debugger;
retrieving a subsequent confirmation value from the register transferred via the device test bus to the register by the debugger responsive to the authentication value; and
closing the normally open switch coupled to the device test bus in parallel with the register to facilitate interconnection, via the device test bus, of the debugger to the electronics of the DUT.

19. The computer-program product of claim 18, wherein, when the debugger is attached to the DUT, an unbroken connection exists between the debugger and the register of the DUT regardless of a current state of the control switch.

20. The computer-program product of claim 18, wherein the reading, generating, retrieving and closing steps are all performed without any other communications with the DUT via any other interfaces associated with the DUT.

\* \* \* \* \*